(12) United States Patent
Oyama

(10) Patent No.: US 10,481,349 B2
(45) Date of Patent: Nov. 19, 2019

(54) OPTICAL PATH CONVERSION DEVICE, OPTICAL INTERFACE APPARATUS, AND OPTICAL TRANSMISSION SYSTEM

(71) Applicant: SONY CORPORATION, Tokyo (JP)

(72) Inventor: Yusuke Oyama, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 15/764,418

(22) PCT Filed: Aug. 18, 2016

(86) PCT No.: PCT/JP2016/074078
§ 371 (c)(1),
(2) Date: Mar. 29, 2018

(87) PCT Pub. No.: WO2017/068843
PCT Pub. Date: Apr. 27, 2017

(65) Prior Publication Data
US 2018/0284367 A1    Oct. 4, 2018

(30) Foreign Application Priority Data

Oct. 20, 2015 (JP) ................................ 2015-206070

(51) Int. Cl.
*G02B 6/42* (2006.01)
*H01L 31/0232* (2014.01)
(Continued)

(52) U.S. Cl.
CPC ........... *G02B 6/4214* (2013.01); *G02B 6/425* (2013.01); *G02B 6/4206* (2013.01); *G02B 6/426* (2013.01);
(Continued)

(58) Field of Classification Search
CPC .... G02B 6/4214; G02B 6/4206; G02B 6/425; G02B 6/426; G02B 6/4246; H01L 31/0232
(Continued)

(56) References Cited

U.S. PATENT DOCUMENTS 6,374,004 B1    4/2002  Han et al.
6,457,875 B1 *  10/2002 Kropp ................. G02B 6/4214
                                                     385/33
(Continued)

FOREIGN PATENT DOCUMENTS

AU     1079001 A    4/2001
CA     2387538 A1   4/2001
(Continued)

OTHER PUBLICATIONS

International Search Report and Written Opinion of PCT Application No. PCT/JP2016/074078, dated Nov. 22, 2016, 09 pages of ISRWO.

*Primary Examiner* — Jerry M Blevins
(74) *Attorney, Agent, or Firm* — Chip Law Group

(57) ABSTRACT

An optical path conversion device according to an embodiment of the present technology is disposed between a plurality of optical devices that are arranged in one line or in a zigzag manner and a plurality of optical fibers that are arranged in one line or in a zigzag manner with an arrangement pitch different from an arrangement pitch of the plurality of optical devices. The optical path conversion device includes a light refractive surface for pitch conversion.

20 Claims, 20 Drawing Sheets

(51) Int. Cl.
  *H01S 5/022*  (2006.01)
  *H01S 5/40*   (2006.01)
(52) U.S. Cl.
  CPC .......... *H01L 31/0232* (2013.01); *H01S 5/022* (2013.01); *H01S 5/02288* (2013.01); *H01S 5/02292* (2013.01); *H01S 5/40* (2013.01); *H01S 5/4025* (2013.01); *G02B 6/4246* (2013.01); *H01S 5/02284* (2013.01)
(58) Field of Classification Search
  USPC ........................................................ 385/89
  See application file for complete search history.

(56)  References Cited

U.S. PATENT DOCUMENTS

| | | |
|---|---|---|
| 2004/0202477 A1 | 10/2004 | Nagasaka et al. |
| 2006/0182442 A1 | 8/2006 | Nagasaka |
| 2006/0209396 A1 | 9/2006 | Tanaka et al. |
| 2009/0252503 A1 | 10/2009 | Ishigami et al. |
| 2014/0153881 A1 | 6/2014 | Liff et al. |

FOREIGN PATENT DOCUMENTS

| | | |
|---|---|---|
| CN | 1523391 A | 8/2004 |
| CN | 1813209 A | 8/2006 |
| DE | 19742895 A1 | 4/1999 |
| EP | 1018052 A1 | 7/2000 |
| EP | 1224495 A1 | 7/2002 |
| EP | 1447695 A2 | 8/2004 |
| JP | 62-65012 A | 3/1987 |
| JP | 62-065012 A | 3/1987 |
| JP | 09-270751 A | 10/1997 |
| JP | 2003-511738 A | 3/2003 |
| JP | 2003-262822 A | 9/2003 |
| JP | 2003-344803 A | 12/2003 |
| JP | 2004-246279 A | 9/2004 |
| JP | 2005-037659 A | 2/2005 |
| JP | 2006-059867 A | 3/2006 |
| JP | 2006-227043 A | 8/2006 |
| JP | 2008-15224 A | 1/2008 |
| JP | 2008-015224 A | 1/2008 |
| JP | 2009-174454 A | 8/2009 |
| JP | 2009-251375 A | 10/2009 |
| JP | 2015-031818 A | 2/2015 |
| TW | 201331652 A | 8/2013 |
| WO | 99/015927 A1 | 4/1999 |
| WO | 01/027676 A1 | 4/2001 |
| WO | 02/073256 A1 | 9/2002 |
| WO | 2004/104666 A1 | 12/2004 |
| WO | 2005/006043 A1 | 1/2005 |
| WO | 2013/101112 A1 | 7/2013 |

\* cited by examiner

[ FIG. 1 ]
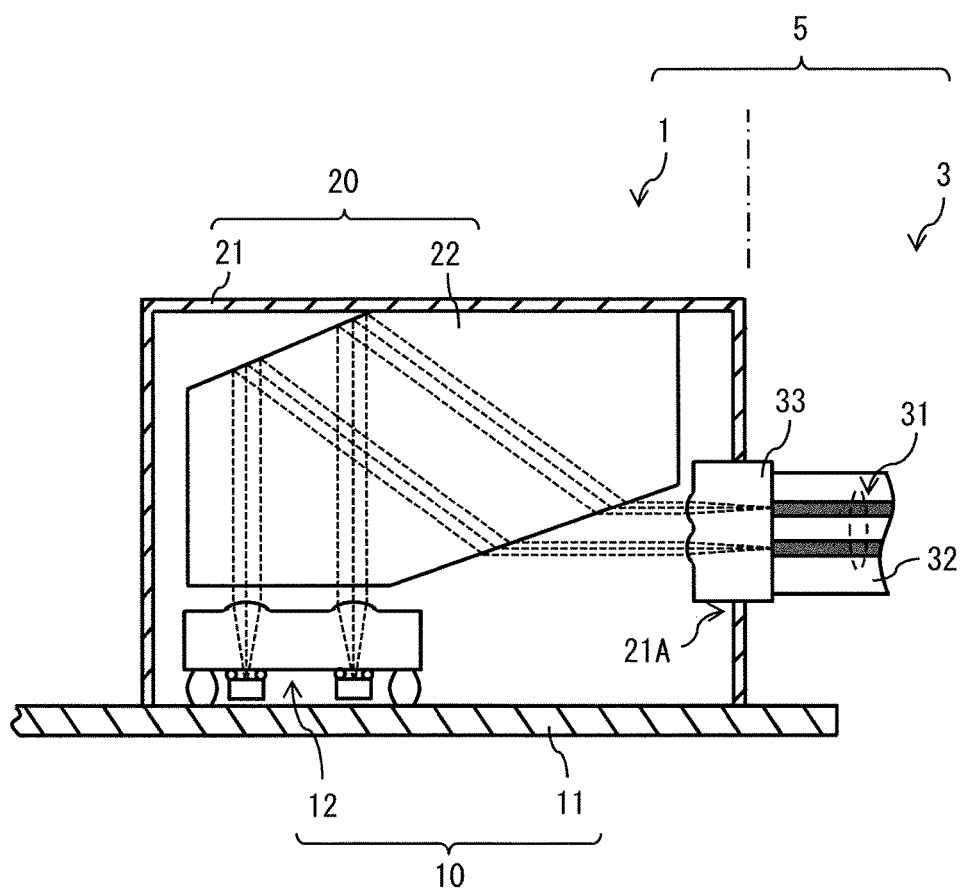

[ FIG. 2 ]
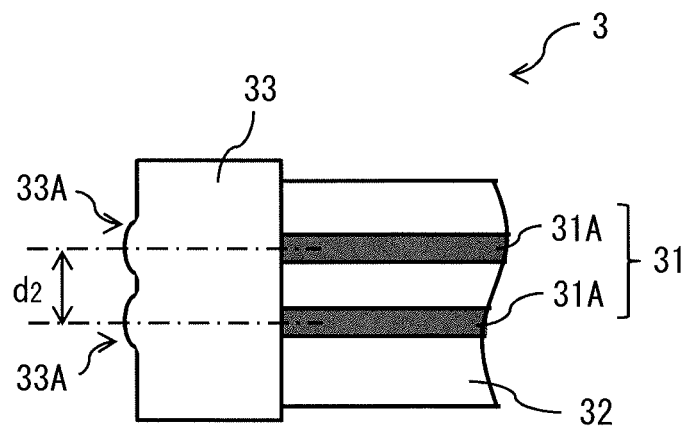
[ FIG. 3 ]
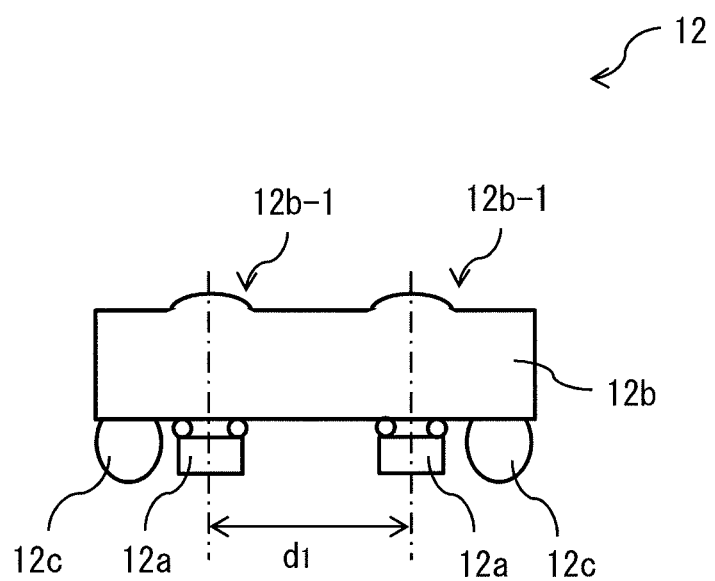

[ FIG. 4 ]
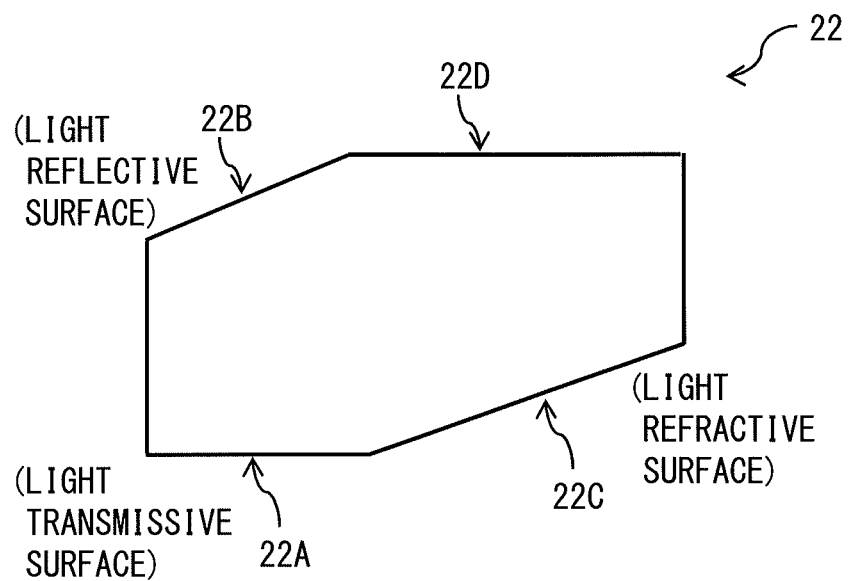

[ FIG. 5 ]
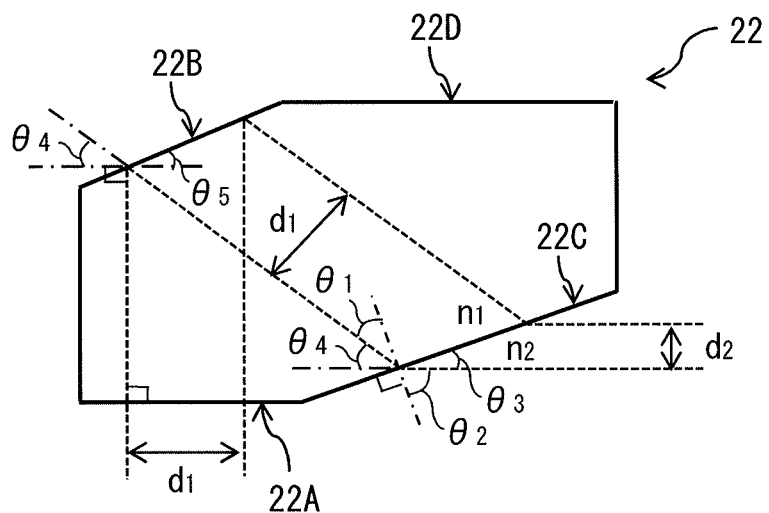
$$\frac{d_1}{\cos \theta_1} = d_2 \cos \theta_2$$
$$\theta_2 = \sin^{-1}\left(\frac{n_1}{n_2 \sin \theta_1}\right)$$
$$\theta_3 = \frac{\pi}{2} - \theta_2$$
$$\theta_4 = \frac{\pi}{2} - \theta_3 - \theta_1$$
$$\theta_5 = \frac{\pi}{4} - \frac{1}{2} \theta_4$$

[ FIG. 6 ]
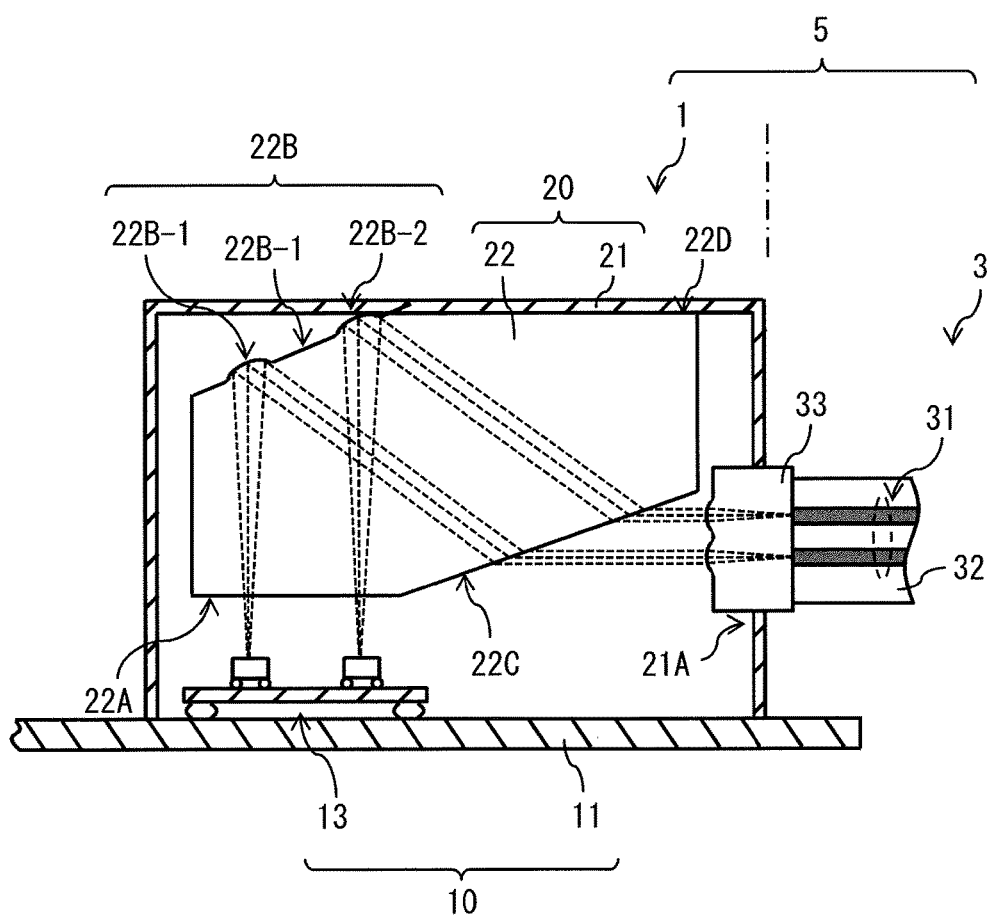

[ FIG. 7 ]
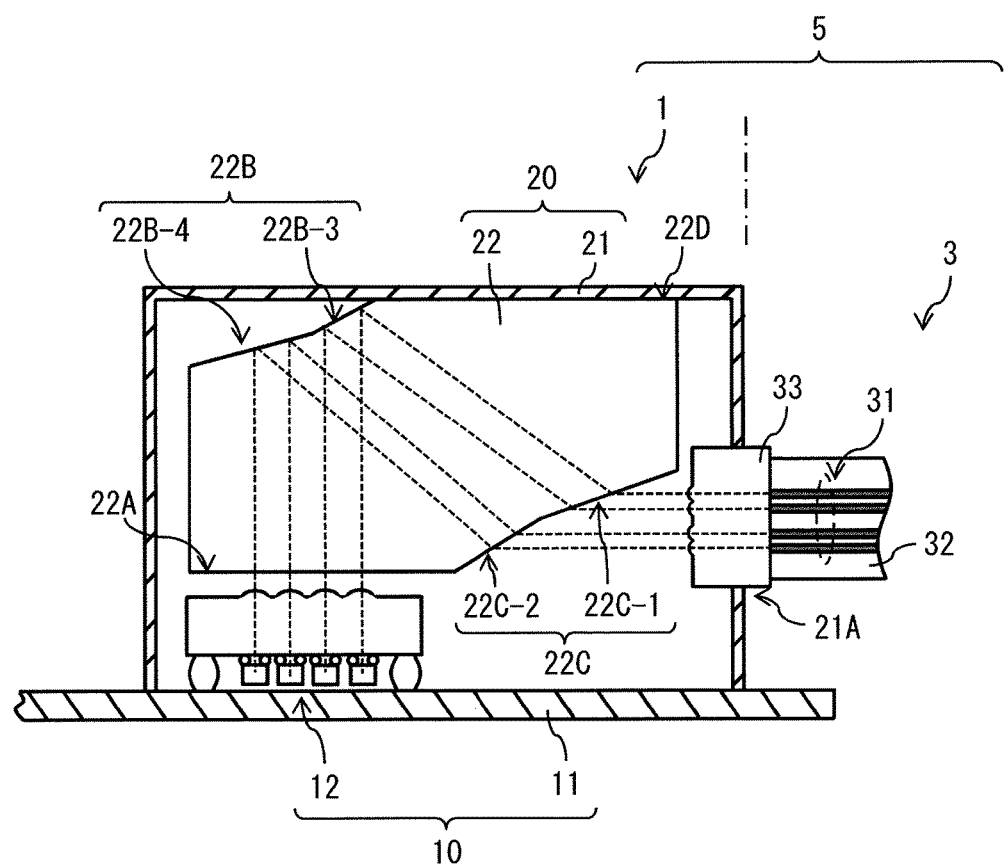

[ FIG. 8 ]
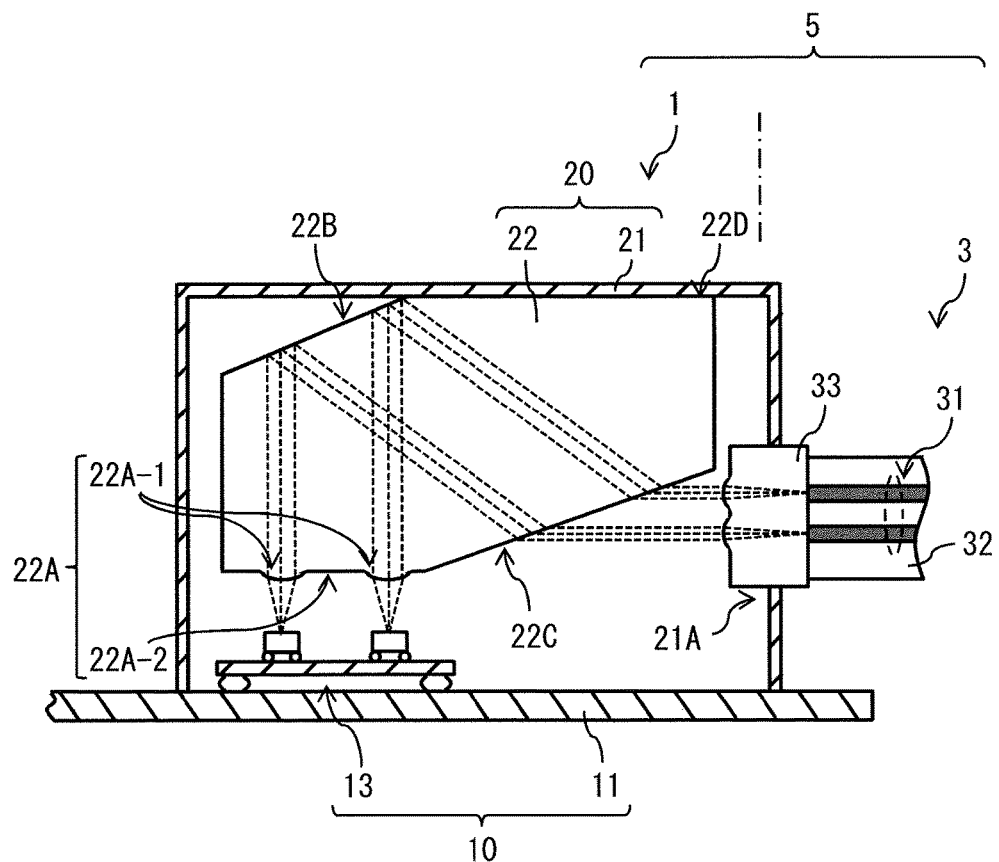

[ FIG. 9 ]
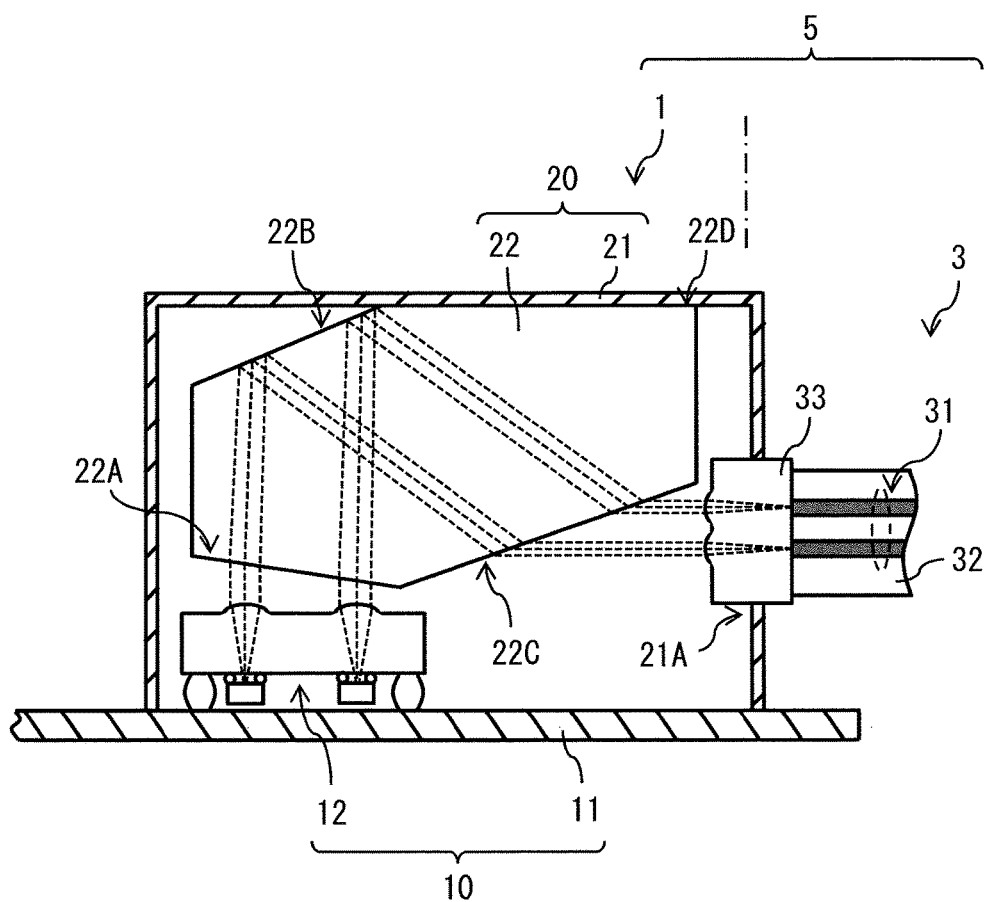

[ FIG. 10 ]
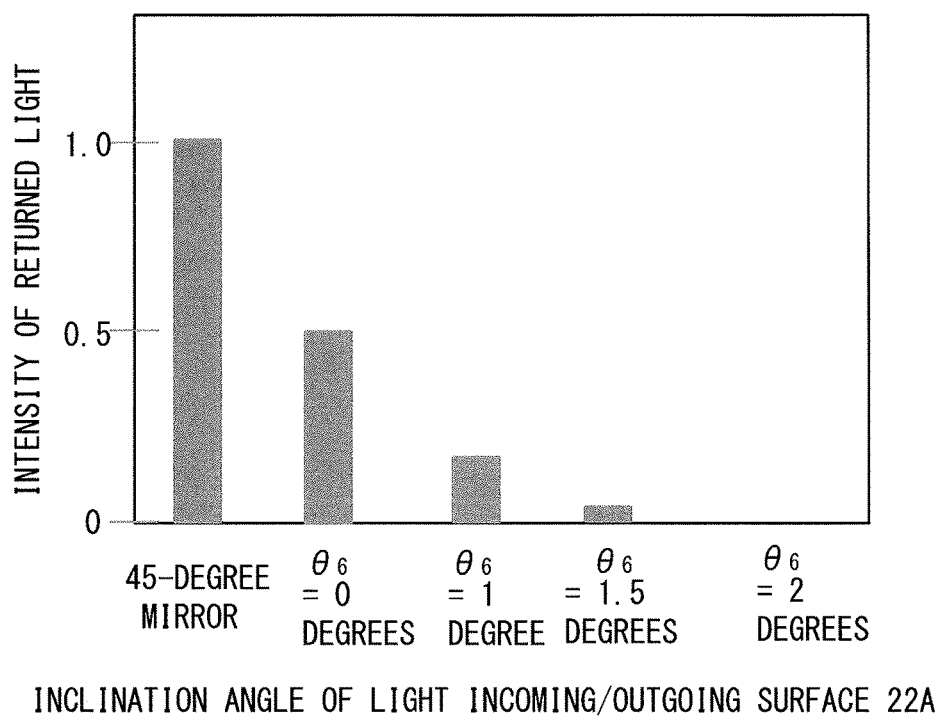

[ FIG. 11 ]
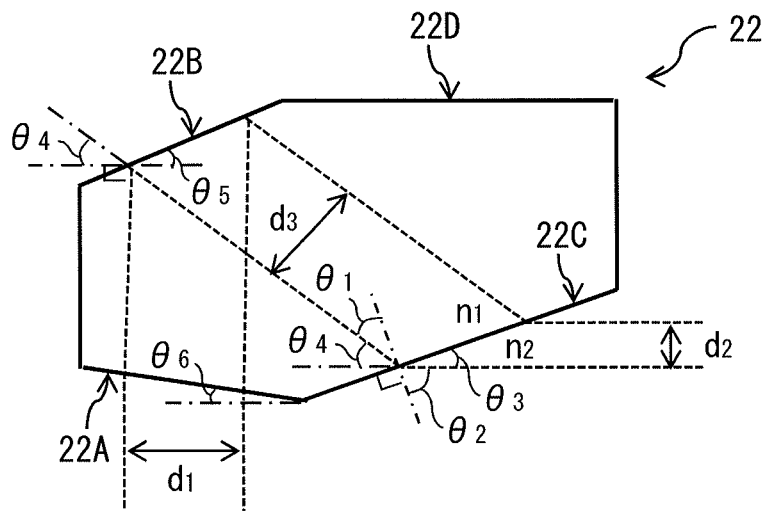
$$\frac{d_3}{\cos \theta_1} = d_2 \cos \theta_2$$
$$\theta_2 = \sin^{-1}\left(\frac{n_1}{n_2 \sin \theta_1}\right)$$
$$\theta_3 = \frac{\pi}{2} - \theta_2$$
$$\theta_4 = \frac{\pi}{2} - \theta_3 - \theta_1$$
$$\theta_5 = \frac{\pi}{4} - \frac{1}{2}\theta_4$$
$$d_3 = f_1(d_1)$$
$$d_1 = f_2(\theta_6)$$

[ FIG. 12 ]
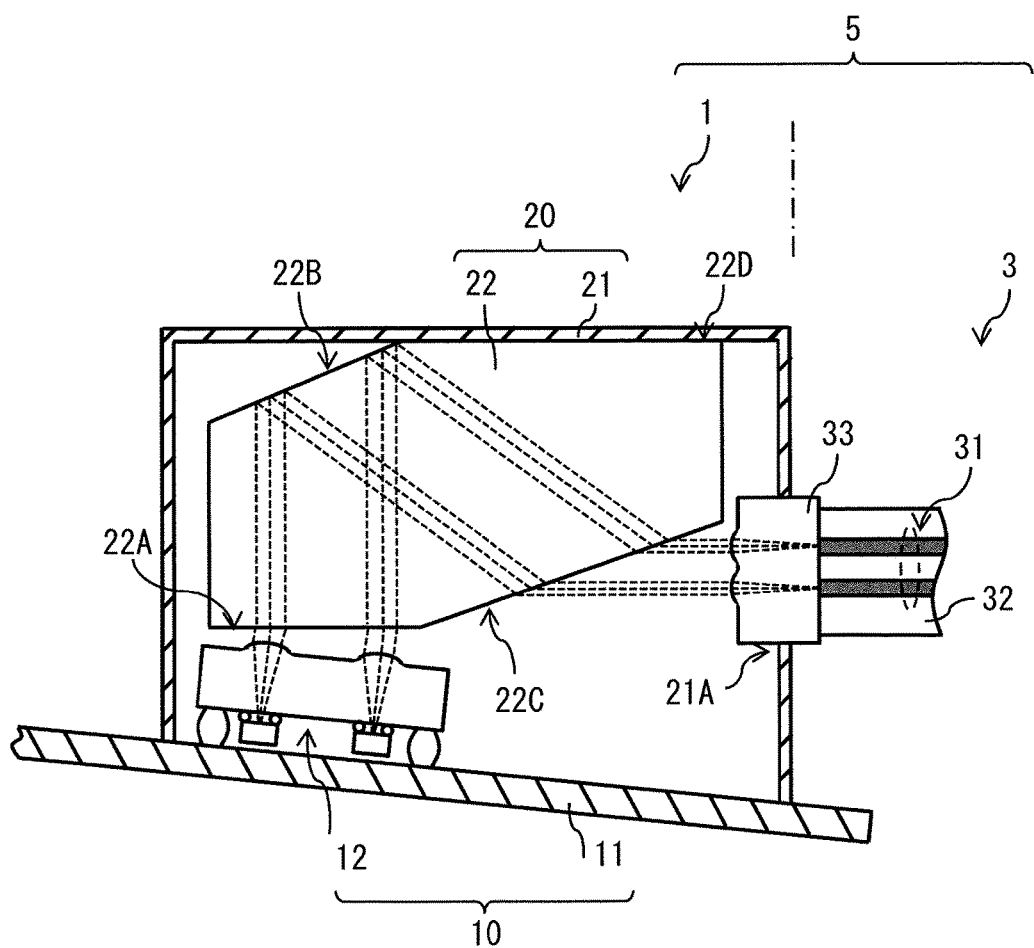

[ FIG. 13 ]
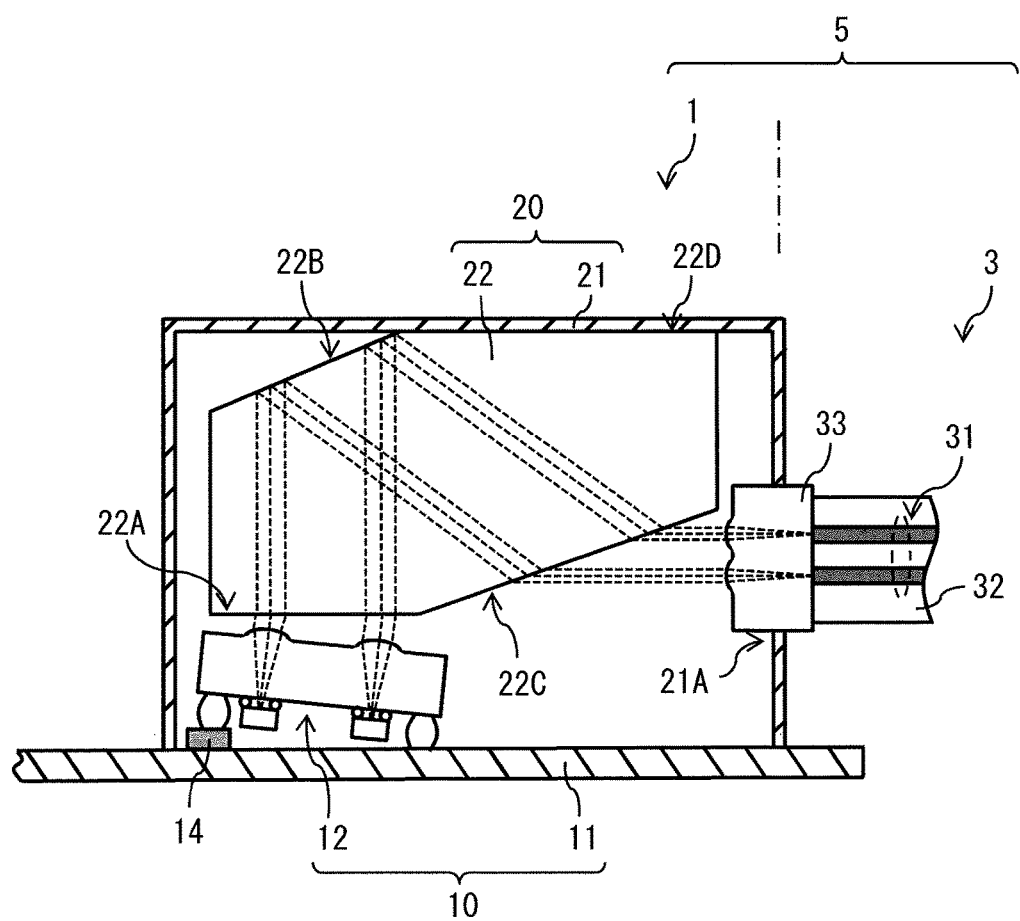

[ FIG. 14 ]
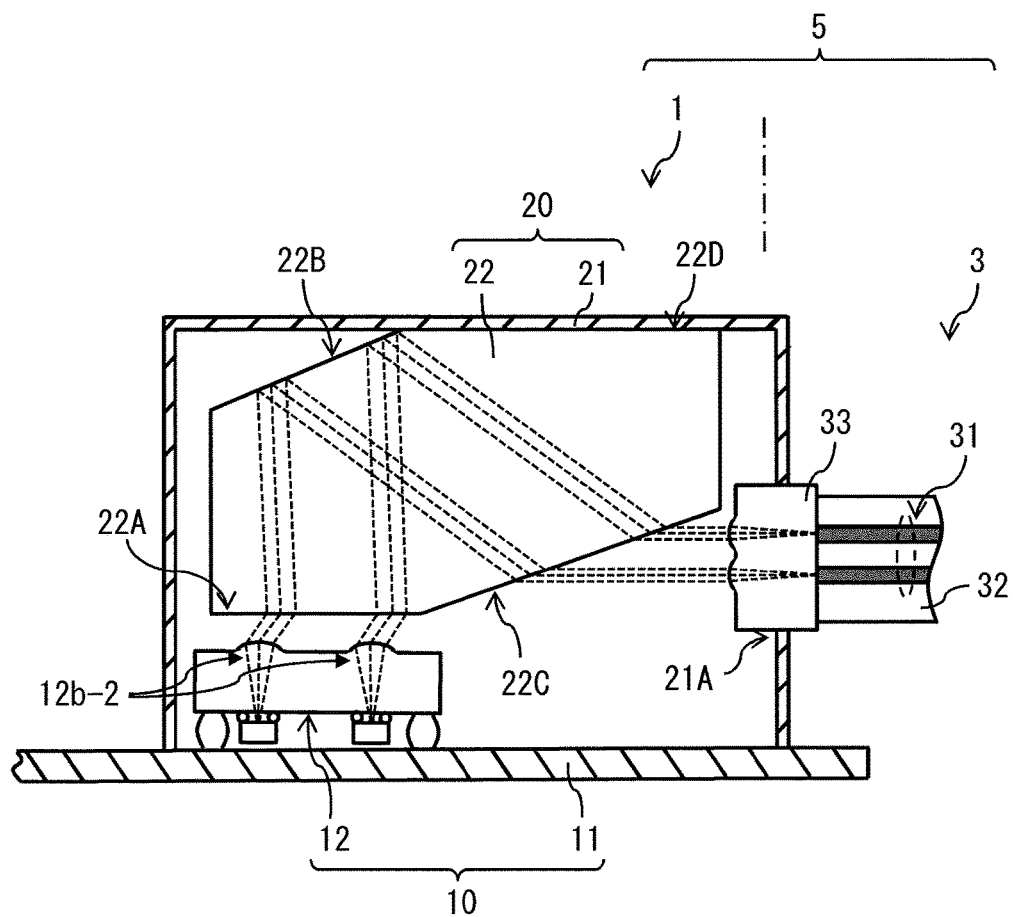

[ FIG. 15 ]
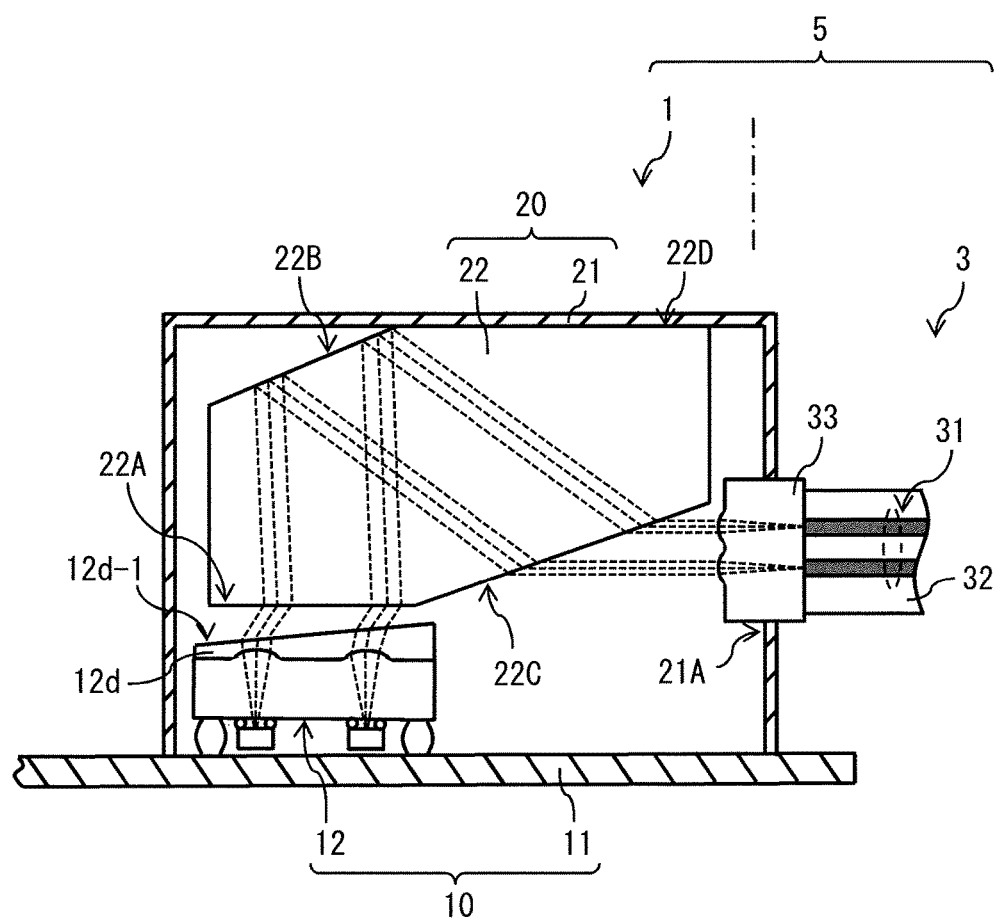

[ FIG. 16 ]
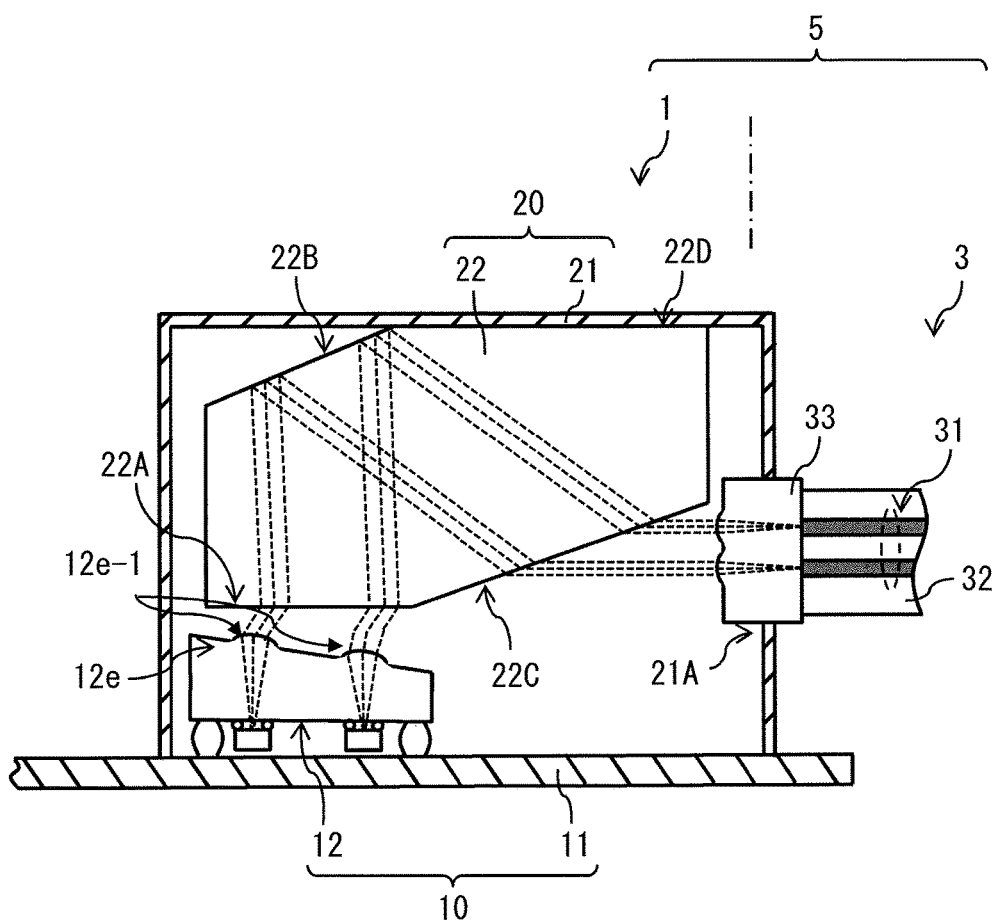

[ FIG. 17 ]
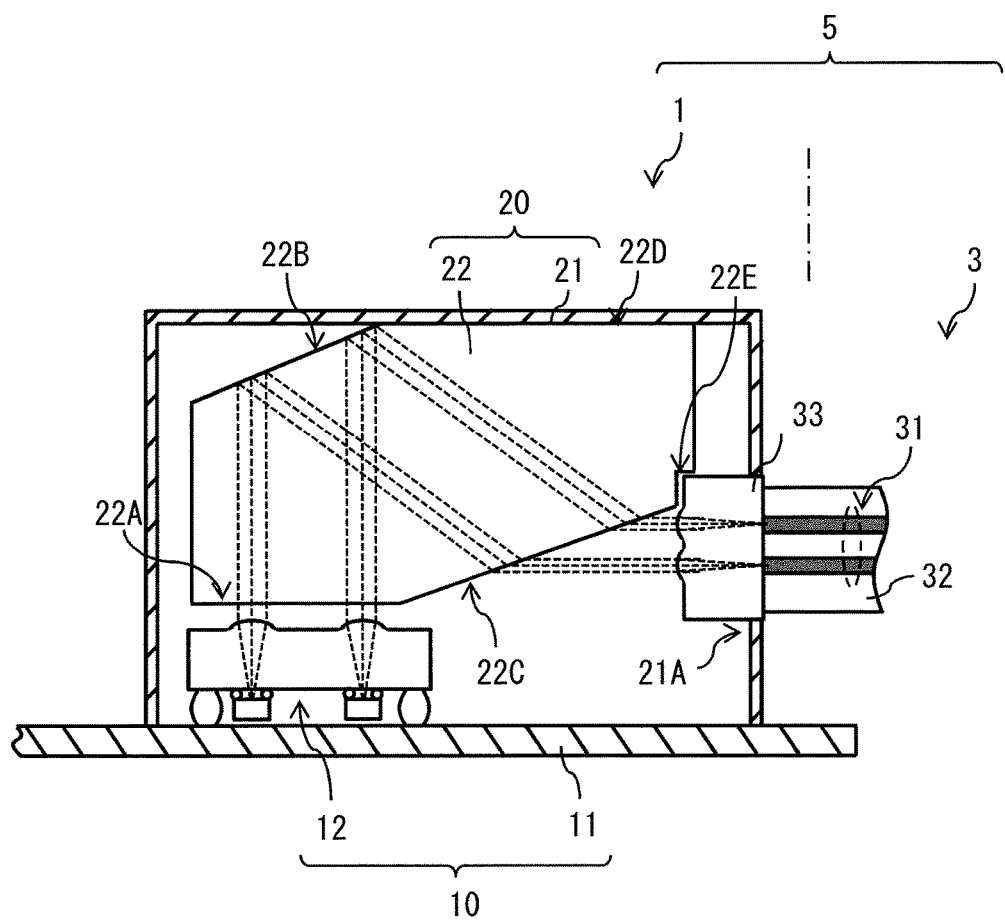

[ FIG. 18 ]
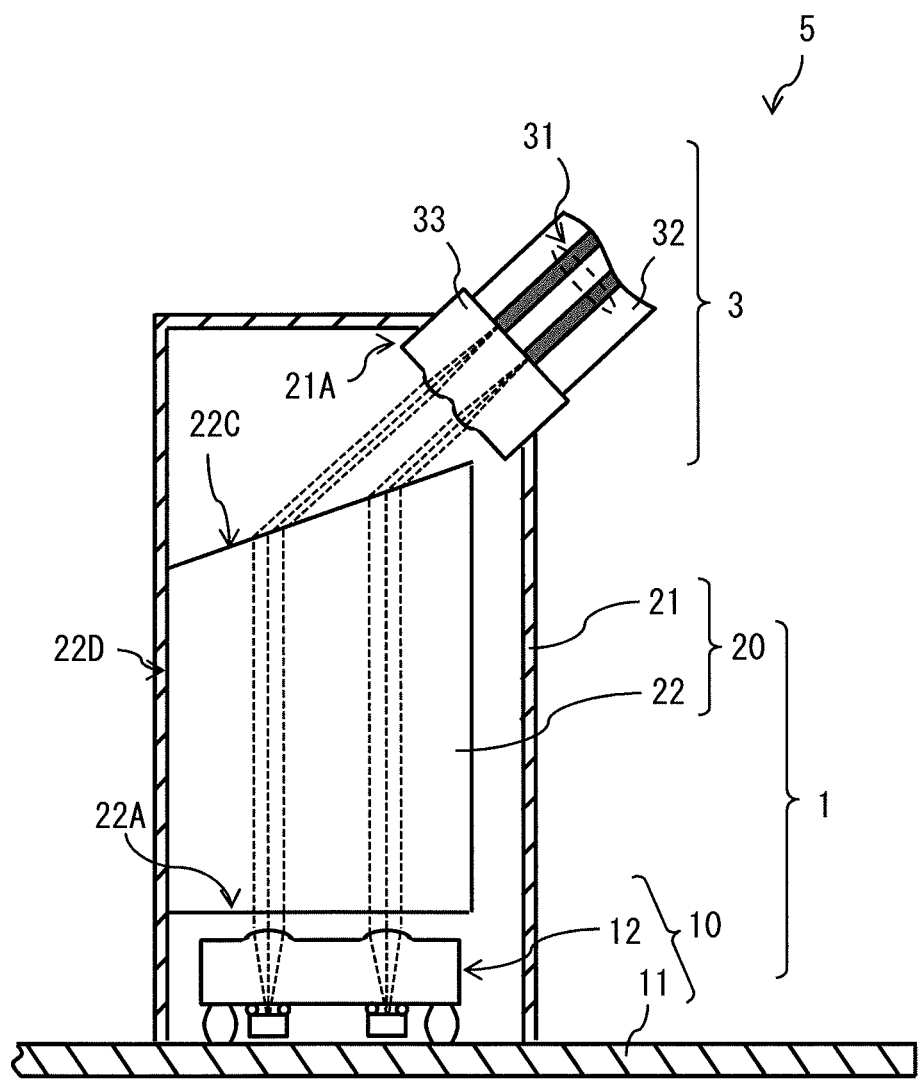

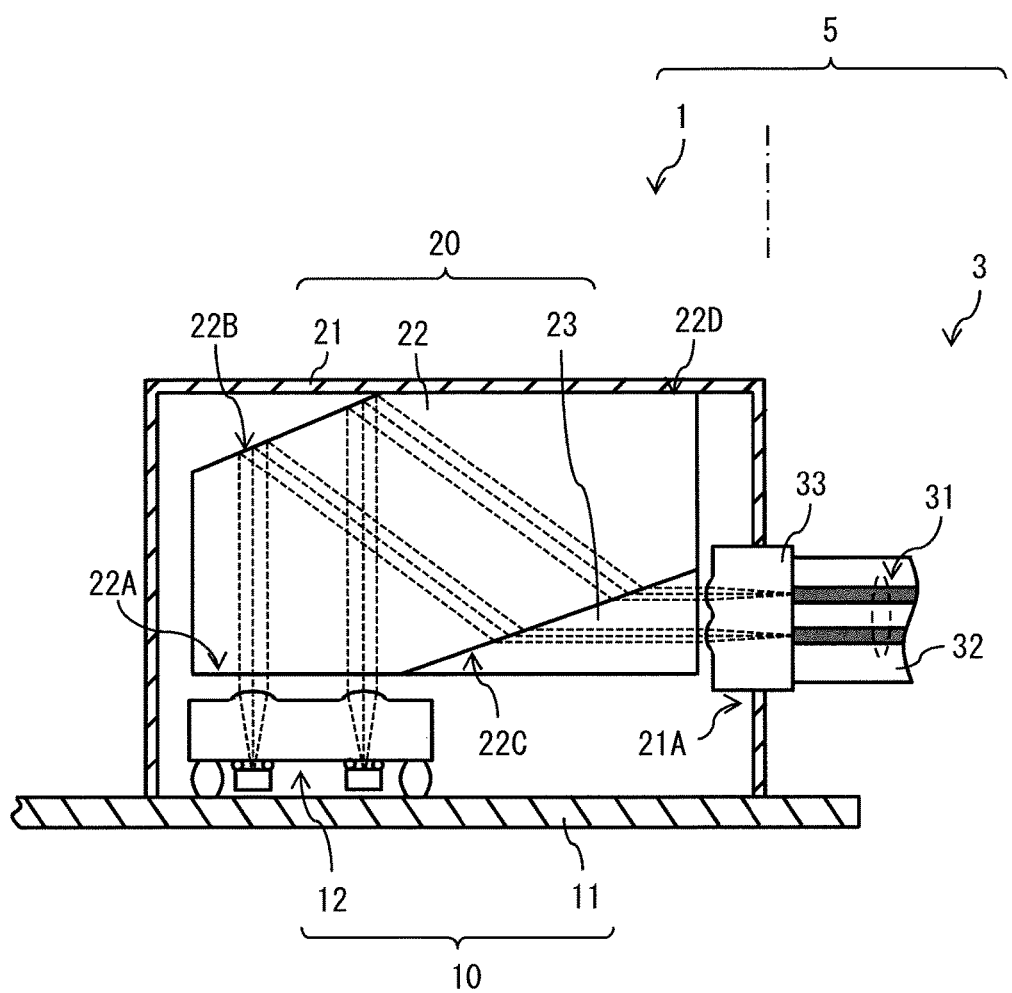
[ FIG. 19 ]

[ FIG. 20 ]
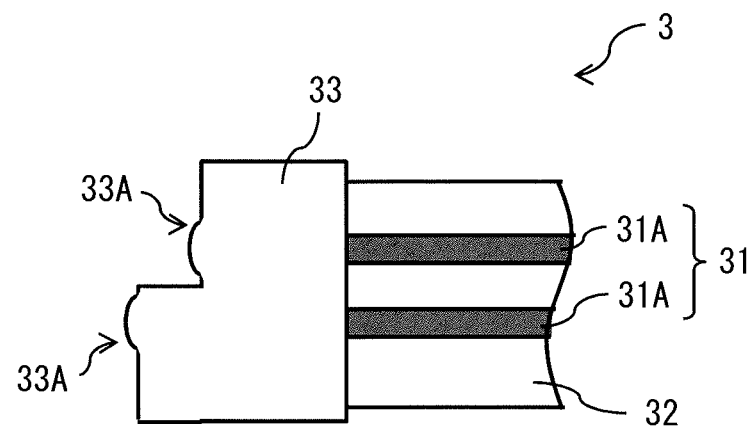
[ FIG. 21 ]
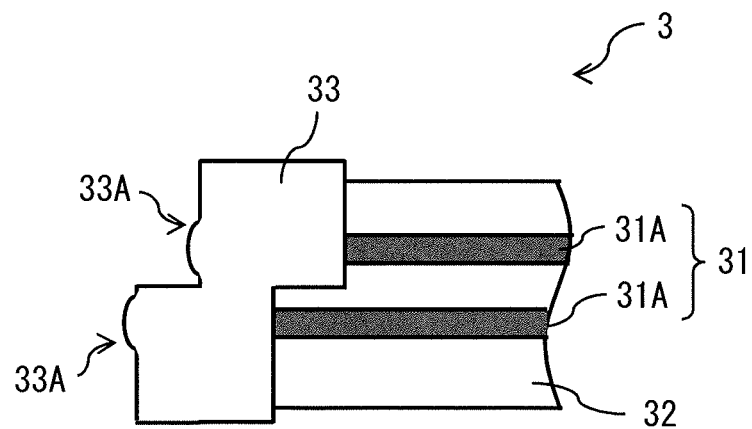

[ FIG. 22A ]
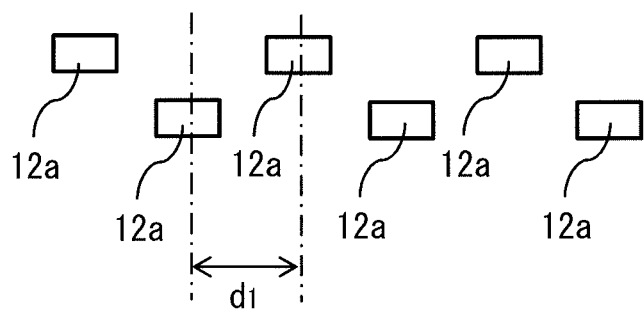
[ FIG. 22B ]
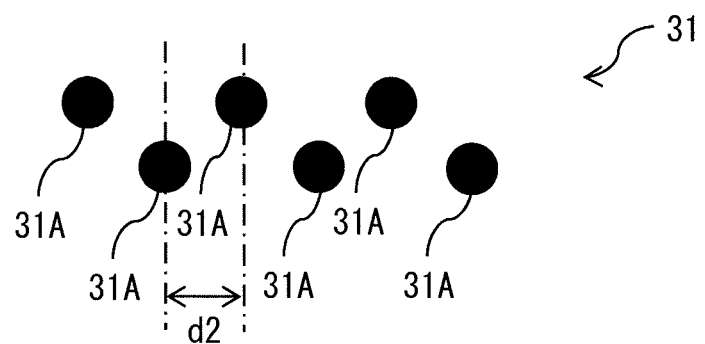

OPTICAL PATH CONVERSION DEVICE, OPTICAL INTERFACE APPARATUS, AND OPTICAL TRANSMISSION SYSTEM

CROSS REFERENCE TO RELATED APPLICATIONS

This application is a U.S. National Phase of International Patent Application No. PCT/JP2016/074078 filed on Aug. 18, 2016, which claims priority benefit of Japanese Patent Application No. JP 2015-206070 filed in the Japan Patent Office on Oct. 20, 2015. Each of the above-referenced applications is hereby incorporated herein by reference in its entirety.

TECHNICAL FIELD

The present technology relates to an optical path conversion device, an optical interface apparatus, and an optical transmission system.

BACKGROUND ART

In optical communication using optical fibers, an optical interface apparatus that includes a light emitting device such as a laser or a light receiving device such as a photodiode is typically used (e.g., refer to PTLs 1 to 4).

CITATION LIST

Patent Literature

PTL 1: WO2004/104666
PTL 2: Japanese Unexamined Patent Application Publication No. H09-270751
PTL 3: WO2002/073256
PTL 4: Japanese Unexamined Patent Application Publication No. 2006-59867

SUMMARY OF INVENTION

In the above-described optical interface apparatus, a plurality of optical devices such as light emitting devices and light receiving devices are arranged in an array, and each of a plurality of optical fibers assigned to each of the optical devices are also arranged in an array. Incidentally, an arrangement pitch of the plurality of optical fibers is typically set to 250 μm. In contrast, an arrangement pitch of the plurality of optical devices is typically set larger than 250 μm due to constraint on installation of the optical devices. Accordingly, the arrangement pitch of the plurality of optical fibers and the arrangement pitch of the plurality of optical devices are different from each other in many cases. Against such an issue, pitch conversion is performable with use of various measures disclosed in, for example, PTLs 1 to 3. The configurations in the measures disclosed in PTLs 1 to 3, however, are complicated, which increases the cost.

Accordingly, it is desirable to provide an optical path conversion device, an optical interface apparatus, and an optical transmission system that each make it possible to perform pitch conversion with a simple configuration.

An optical path conversion device according to an embodiment of the present technology is disposed between a plurality of optical devices that are arranged in one line or in a zigzag manner and a plurality of optical fibers that are arranged in one line or in a zigzag manner with an arrangement pitch different from an arrangement pitch of the plurality of optical devices. The optical path conversion device includes a light refractive surface for pitch conversion.

In the optical path conversion device according to the embodiment of the present technology, the light refractive surface for pitch conversion is provided. Therefore, the pitch conversion is performed with an extremely simple configuration in the present technology.

An optical interface apparatus according to an embodiment of the present technology includes: a plurality of optical devices that are arranged in one line or in a zigzag manner; and an optical path conversion device that includes a first light refractive surface inclined to an arrangement direction of the plurality of optical devices.

In the optical interface apparatus according to the embodiment of the present technology, the first light refractive surface that is inclined to the arrangement direction of the plurality of optical devices is provided. The first light refractive surface exerts a function as pitch conversion, for example, in a case where the first light refractive surface is disposed between the plurality of optical devices that are arranged in one line or in a zigzag manner and a plurality of optical fibers that are arranged in one line or in a zigzag manner with an arrangement pitch different from an arrangement pitch of the plurality of optical devices. Therefore, the pitch conversion is performed with an extremely simple configuration in the present technology.

An optical transmission system according to an embodiment of the present technology includes: a plurality of optical devices that are arranged in one line or in a zigzag manner; an optical path conversion device that includes a first light refractive surface inclined to an arrangement direction of the plurality of optical devices; and an optical fiber array that includes a plurality of optical fibers arranged in one line or in a zigzag manner in a direction corresponding to the arrangement direction of the plurality of optical devices. The optical transmission system further includes a housing that includes an insertion port into which a front end of the optical fiber array is inserted, and houses the plurality of optical devices and the optical path conversion device.

In the optical transmission system according to the embodiment of the present technology, the first light refractive surface that is inclined to the arrangement direction of the plurality of optical devices is provided. In this case, in a case where the front end of the optical fiber array is inserted into the insertion port of the housing, the first light refractive surface exerts a function as pitch conversion. Therefore, the pitch conversion is performed with an extremely simple configuration in the present technology.

In the optical path conversion device, the optical interface apparatus, and the optical transmission system according to the respective embodiments of the present technology, the first light refractive surface that is inclined to the arrangement direction of the plurality of optical devices is provided, which makes it possible to perform the pitch conversion with the simple configuration. Note that effects achieved by the present technology are not limited to the effects described here, and may be any of effects described in the present specification.

BRIEF DESCRIPTION OF DRAWINGS

FIG. 1 is a cross-sectional view of an example of an optical transmission system according to an embodiment of the present technology.
FIG. 2 is a schematic diagram illustrating an example of an optical fiber module of FIG. 1.

FIG. 3 is a schematic diagram illustrating an example of a photoelectric converter of FIG. 1.

FIG. 4 is a schematic diagram illustrating an example of an optical path conversion device of FIG. 1.

FIG. 5 is a schematic diagram illustrating a design example of the optical path conversion device of FIG. 4.

FIG. 6 is a cross-sectional view of a modification example of the optical transmission system of FIG. 1.

FIG. 7 is a cross-sectional view of a modification example of the optical transmission system of FIG. 1.

FIG. 8 is a cross-sectional view of a modification example of the optical transmission system of FIG. 1.

FIG. 9 is a cross-sectional view of a modification example of the optical transmission system of FIG. 1.

FIG. 10 is a relationship diagram illustrating an example of relationship between an inclination angle of a light incoming/outgoing surface and intensity of returned light, in an optical path conversion device of FIG. 9.

FIG. 11 is a schematic diagram illustrating a design example of the optical path conversion device of FIG. 10.

FIG. 12 is a cross-sectional view of a modification example of the optical transmission system of FIG. 1.

FIG. 13 is a cross-sectional view of a modification example of the optical transmission system of FIG. 1.

FIG. 14 is a cross-sectional view of a modification example of the optical transmission system of FIG. 1.

FIG. 15 is a cross-sectional view of a modification example of the optical transmission system of FIG. 1.

FIG. 16 is a cross-sectional view of a modification example of the optical transmission system of FIG. 1.

FIG. 17 is a cross-sectional view of a modification example of the optical transmission system of FIG. 1.

FIG. 18 is a cross-sectional view of a modification example of the optical transmission system of FIG. 1.

FIG. 19 is a cross-sectional view of a modification example of the optical transmission system of FIG. 1.

FIG. 20 is a schematic diagram illustrating a modification example of the optical fiber module of FIG. 1.

FIG. 21 is a schematic diagram illustrating a modification example of the optical fiber module of FIG. 1.

FIG. 22A is a schematic diagram illustrating a modification example of arrangement of a plurality of optical devices of FIG. 3.

FIG. 22B is a schematic diagram illustrating a modification example of arrangement of a plurality of optical fibers of FIG. 2.

MODES FOR CARRYING OUT THE INVENTION

Modes for carrying out the invention are described in detail below with reference to drawings. Note that description is given in the following order.

1. Embodiment (FIG. 1 to FIG. 5)
    Example in which light refractive surface for pitch conversion is provided
2. Modification Examples (FIG. 6 to FIG. 21)
    Example in which plurality of convex lens parts are provided on light reflective surface (FIG. 6)
    Example in which light refractive surface and light reflective surface each include plurality of flat surfaces (FIG. 7)
    Example in which plurality of convex lenses are provided on light transmissive surface (FIG. 8)
    Example in which light transmissive surface is inclined surface (FIG. 9 to FIG. 11)
    Example in which optical devices are disposed obliquely to light transmissive surface (FIG. 12 and FIG. 13)
    Example in which eccentric lenses are provided (FIG. 14)
    Example in which inclined portion including inclined surface is provided on optical devices (FIG. 15)
    Example in which plurality of lenses on optical devices are disposed obliquely (FIG. 16)
    Example in which positioning mechanism of optical fiber module is provided (FIG. 17)
    Example in which light reflective surface is not provided (FIG. 18)
    Example in which light refractive surface serves as boundary between two block-shaped optical devices (FIG. 19)
    Example in which steps are provided at front end of optical fiber module (FIG. 20 and FIG. 21)
    Example in which plurality of optical devices and plurality of optical fibers are each arranged in zigzag manner (FIG. 22A and FIG. 22B)

1. Embodiment

[Configuration]

FIG. 1 illustrates an example of a cross-sectional configuration of an optical transmission system 5 according to an embodiment of the present technology. The optical transmission system 5 is configured through optical coupling of a plurality of optical devices and a plurality of optical fibers one by one. The plurality of optical devices are arranged in one line, and the plurality of optical fibers are arranged in one line with an arrangement pitch that is different from an arrangement pitch of the plurality of optical devices. Specifically, the optical transmission system 5 is configured through optical coupling of an optical interface apparatus 1 and an optical fiber module 3.

[Optical Fiber Module 3]

The optical fiber module 3 transmits light generated outside to the optical interface apparatus 1, or transmits light generated by the optical interface apparatus 1 to the outside. FIG. 2 illustrates an example of a schematic configuration of the optical fiber module 3. The optical fiber module 3 includes an optical fiber array 31, a holding member 32, and a plug lens 33.

The optical fiber array 31 includes a plurality of optical fibers 31A that are arranged in one line in a direction corresponding to an arrangement direction of a plurality of optical devices 12a described later. The "direction corresponding to the arrangement direction of the plurality of optical devices 12a" indicates a direction in which the plurality of optical fibers 31A and the plurality of optical devices 12a are optically coupled to each other through an optical path conversion device 22 described later. The plurality of optical fibers 31A in the optical path conversion device 22 are arranged in one line with an arrangement pitch (d2) that is different from an arrangement pitch (d1) of the plurality of optical devices 12a described later. The arrangement pitch (d2) is smaller than the arrangement pitch (d1), and is, for example, about several hundred μm. In the present embodiment, the plurality of optical fibers 31A are arranged in one horizontal line with equal intervals. A cylindrical ferrule is provided on a front end of each of the optical fibers 31A as necessary.

The holding member 32 holds and protects the optical fiber array 31. The plug lens 33 is coupled to a front end of the optical fiber array 31. The plug lens 33 includes a plurality of convex lens parts 33A at a position facing the front end of the optical fiber array 31. One of the plurality of convex lens parts 33A are assigned to each of the optical fibers 31A, and specifically, the plurality of convex lens parts 33A are provided one by one at positions respectively facing the front ends of the optical fibers 31A. An optical axis of each of the convex lens parts 33A is coincident with or is substantially coincident with an optical axis of a corresponding one of the optical fibers 31A. Accordingly, the plurality of convex lens parts 33A are arranged in one line in a predetermined direction, as with the plurality of optical fibers 31A. In a case where the plurality of optical fibers 31A are arranged with the arrangement pitch d2, the plurality of convex lens parts 33A are also arranged with the arrangement pitch d2. The plug lens 33 includes a mechanism that is detachably fixed to an insertion port 21A described later in a case where the plug lens 33 is inserted into the insertion port 21A.

[Optical Interface Apparatus 1]

The optical interface apparatus 1 includes a substrate mounting photoelectric conversion unit 10 and an optical receptacle 20.

[Photoelectric Conversion Unit 10]

The photoelectric conversion unit 10 includes a circuit substrate 11 and a photoelectric converter 12. The circuit substrate 11 is configured by mounting, for example, a control circuit or the like to control the photoelectric converter 12, on a substrate. The photoelectric converter 12 is controlled by the circuit substrate 11, thereby performing photoelectric conversion. The photoelectric converter 12 is electrically coupled to, for example, an electrode pad provided on a top surface of the circuit substrate 11. The photoelectric converter 12 is coupled to the electrode pad of the circuit substrate 11 through, for example, solder bumps 12c described later.

FIG. 3 illustrates an example of a schematic configuration of the photoelectric converter 12. For example, the photoelectric converter 12 includes the plurality of optical devices 12a that are arranged in one line in a predetermined direction. Each of the optical devices 12a is, for example, a semiconductor light emitting device or a semiconductor light receiving device. The semiconductor light emitting device outputs light superposed with predetermined information, under control of the circuit substrate 11. The semiconductor light emitting device is, for example, a semiconductor laser or a light emitting diode. The semiconductor light receiving device detects light from the optical fiber module 3 under control of the circuit substrate 11. The semiconductor light receiving device includes, for example, a photodiode. In a case where each of the optical devices 12a is the semiconductor light emitting device, a surface of each of the optical devices 12a on a side opposite to the circuit substrate 11 is a light outgoing surface, and light from each of the optical devices 12a is outputted in a direction perpendicular to or substantially perpendicular to the light outgoing surface. In a case where each of the optical devices 12a is the semiconductor light receiving device, a surface of each of the optical devices 12a on the side opposite to the circuit substrate 11 is a light incoming surface, and light from the optical fiber module 3 enters the light incoming surface perpendicularly or substantially perpendicularly. Each of the optical devices 12a has a chip shape. Each of the optical devices 12a has a size of, for example, about several hundred µm.

The photoelectric converter 12 further includes, for example, a receptor lens 12b. The receptor lens 12b holds the optical devices 12a and functions as a lens with respect to light outputted from the optical devices 12a or light entering the optical devices 12a. The photoelectric converter 12 further includes, for example, the plurality of solder bumps 12c that are electrically coupled to the plurality of optical devices 12a. The receptor lens 12b and the plurality of solder bumps 12c may be omitted as necessary. In a case where the receptor lens 12b and the plurality of solder bumps 12c are omitted, the optical devices 12a are directly coupled to the circuit substrate 11.

The receptor lens 12b includes, for example, a wiring pattern on a rear surface. The plurality of optical devices 12a and the plurality of solder bumps 12c are electrically coupled to each other through the wiring pattern. The receptor lens 12b includes, for example, a plurality of convex lens parts 12b-1 on a top surface. The plurality of convex lens parts 12b-1 are disposed between the optical devices 12a and a surface (incoming/outgoing surface 22A) facing the optical devices 12a of the optical path conversion device 22. One of the plurality of convex lens parts 12b-1 is assigned to each of the optical devices 12a. Specifically, the plurality of convex lens parts 12b-1 are provided at positions respectively facing the optical devices 12a. An optical axis of each of the convex lens parts 12b-1 is coincident with or is substantially coincident with an optical axis of a corresponding one of the optical devices 12a. Accordingly, the plurality of convex lens parts 12b-1 are arranged in one line in a predetermined direction as with the plurality of optical devices 12a. In a case where the plurality of optical devices 12a are arranged with the arrangement pitch d1, the plurality of convex lens parts 12b-1 are also arranged with the arrangement pitch d1. The receptor lens 12b has a chip shape. The receptor lens 12b has a size of, for example, about several mm.

[Optical Receptacle 20]

The optical receptacle 20 is used for optical coupling of the optical fiber module 3 to the photoelectric converter 12. The optical receptacle 20 includes a housing 21 and the optical path conversion device 22. The housing 21 houses the photoelectric converter 12 (or plurality of optical devices 12a) and the optical path conversion device 22, and holds the optical path conversion device 22 at a predetermined position. The housing 21 is fixed to a predetermined position of the circuit substrate 11. The housing 21 is fixed to the predetermined position of the circuit substrate 11, which causes the optical conversion device 22 to be fixed to a predetermined position with respect to the photoelectric converter 12. The housing 21 includes the insertion port 21A into which the front end of the optical fiber array 31 is inserted.

FIG. 4 illustrates an example of a schematic configuration of the optical path conversion device 22. The optical path conversion device 22 is disposed between the plurality of optical devices 12a that are arranged in one line and the plurality of optical fibers 31A that are arranged in one line with the arrangement pitch (d2) different from the arrangement pitch (d1) of the plurality of optical devices 12a. The optical path conversion device 22 is a block-shaped optical device having light transmission property to light from the photoelectric converter 12 or light from the optical fiber module 3. The optical path conversion device 22 includes, for example, a light transmissive polyhedron that has a refractive index higher than a refractive index of the surrounding space of the optical path conversion device 22. The optical path conversion device 22 includes a polyhedron containing, for example, glass, crystal, a resin, or the like. The polyhedron may be formed by, for example, molding, cutting, etc.

The optical path conversion device 22 includes the incoming/outgoing surface 22A at a position facing the respective optical devices 12a. The incoming/outgoing surface 22A faces the respective optical devices 12a with a predetermined gap in between. The incoming/outgoing surface 22A is in contact with air. In the present embodiment, the incoming/outgoing surface 22A is a flat surface, and is disposed so as to perpendicularly intersect with the optical axes of the respective optical devices 12a. The optical path conversion device 22 further includes an incoming/outgoing surface 22C. The incoming/outgoing surface 22C corresponds to a specific example of "first light refractive surface" and "light refractive surface" in the present technology. The incoming/outgoing surface 22C is a light refractive surface for pitch conversion, and is disposed obliquely to the arrangement direction of the plurality of optical devices 12a and the arrangement direction of the plurality of optical fibers 31A. The incoming/outgoing surfaces 22A and 22C are provided on a surface of the block-shaped optical device configuring the optical path conversion device 22. The incoming/outgoing surface 22C obliquely faces the insertion port 21A with a predetermined gap in between.

The incoming/outgoing surface 22C is disposed such that an angle formed by a line segment parallel to an optical axis of the insertion port 21A and the incoming/outgoing surface 22C is smaller than 45 degrees. This is to convert optical fluxes of the respective optical fibers 31A entering the incoming/outgoing surface 22C with a narrow pitch (arrangement pitch (d2)) into optical fluxes with a wide pitch (arrangement pitch (d1)) by the incoming/outgoing surface 22C. Further, this is to convert optical fluxes of the respective optical devices 12a entering the incoming/outgoing surface 22C with a wide pitch (arrangement pitch (d1)) into optical fluxes with a narrow pitch (arrangement pitch (d2)) by the incoming/outgoing surface 22C. Moreover, this has an effect of reducing a thickness of the optical path conversion device 22, and an effect of lowering the position of the plug lens 33 to reduce the height of the optical transmission system 5. The incoming/outgoing surface 22C is in contact with air. In the present embodiment, the incoming/outgoing surface 22C is a flat surface, and is disposed so as to obliquely intersect with the optical axes of the respective optical fibers 31A at an angle smaller than 45 degrees.

The optical path conversion device 22 further includes a reflective surface 22B in an optical path between the incoming/outgoing surface 22A and the plurality of optical devices 12a. The reflective surface 22B corresponds to a specific example of "light reflective surface" in the present technology. The reflective surface 22B is disposed at a position on a side opposite to the incoming/outgoing surface 22A, of the light transmissive polyhedron configuring the optical path conversion device 22. The reflective surface 22B is disposed such that an angle formed by a line segment parallel to the optical axis of the insertion port 21A and the reflective surface 22B is smaller than 45 degrees. This is because, in a case where the light entering from the incoming/outgoing surface 22A is reflected by the reflective surface 22B, it is easy to cause reflected light to enter the optical devices 12a in parallel or substantially in parallel to the optical axes of the respective optical devices 12a. The reflective surface 22B is in contact with air. In the present embodiment, the reflective surface 22B is a flat surface, and is disposed so as to obliquely intersect with the optical axes of the respective optical fibers 31A at an angle smaller than 45 degrees. The optical path conversion device 22 further includes a fixed surface 22D on a top surface. The fixed surface 22D is a surface to be fixed to the housing 21A and is fixed to the housing 21 through, for example, an adhesive.

FIG. 5 illustrates a design example of the optical path conversion device 22. The arrangement pitch (d1) of the plurality of optical devices 12a is set to 0.5 mm, and the arrangement pitch (d2) of the plurality of optical fibers 31A is set to 0.24 mm. Further, a refractive index n1 of the optical path conversion device 22 is set to 1.5, and a refractive index n2 of an environmental medium (air) is set to 1.0. At this time, an angle θ1 becomes 38 degrees from an expression in FIG. 5, and an angle θ2 becomes 68 degrees from an expression in FIG. 5. Accordingly, an inclination angle (angle θ3) of the incoming/outgoing surface 22C becomes 23 degrees. At this time, an angle θ4 becomes 28 degrees from an expression in FIG. 5. Accordingly, an inclination angle (angle θ5) of the reflective surface 22B becomes 31 degrees from an expression in FIG. 5.

[Effects]

Next, effects of the optical transmission system 5 are described.

In optical communication using optical fibers, an optical interface apparatus that includes a light emitting device such as a laser or a light receiving device such as a photodiode is typically used. In the above-described optical interface apparatus, a plurality of optical devices such as light emitting devices and light receiving devices are arranged in an array, and one of a plurality of optical fibers assigned to each of the optical devices are also arranged in an array. Incidentally, an arrangement pitch of the plurality of optical fibers is typically set to 250 μm. In contrast, an arrangement pitch of the plurality of optical devices is typically set larger than 250 μm due to constraint on installation of the optical devices. Accordingly, the arrangement pitch of the plurality of optical fibers and the arrangement pitch of the plurality of optical devices are different from each other in many cases. Against such an issue, pitch conversion is performable with use of various measures disclosed in, for example, the above-described PTLs 1 to 3. The configurations in the measures disclosed in the above-described PTLs 1 to 3, however, are complicated, which increases the cost.

In contrast, the optical transmission system 5 includes the incoming/outgoing surface 22C that functions as the light refractive surface inclined to the arrangement direction of the plurality of optical devices 12a. The incoming/outgoing surface 22C is disposed between the plurality of optical devices 12a that are arranged in one line and the plurality of optical fibers 31A that are arranged in one line with the arrangement pitch (d1) different from the arrangement pitch (d2) of the plurality of optical devices 12a in the case where the front end of the optical fiber array 31 is inserted into the insertion port 21A of the housing 21. Accordingly, the incoming/outgoing surface 22C exerts pitch conversion function. As described above, the pitch conversion is performed with an extremely simple configuration in the optical transmission system 5. Accordingly, it is possible to perform the pitch conversion with the simple configuration in the optical transmission system 5.

Further, in the optical transmission system 5, the incoming/outgoing surface 22C is disposed such that the angle formed by the line segment parallel to the optical axis of the insertion port 21A and the incoming/outgoing surface 22C is smaller than 45 degrees. This makes it possible to convert the optical fluxes of the respective optical fibers 31A entering the incoming/outgoing surface 22C with a narrow pitch (arrangement pitch (d2)) into optical fluxes with a wide pitch (arrangement pitch (d1)) by the incoming/outgoing surface 22C. Further, it is possible to convert the optical fluxes of the respective optical devices 12a entering the incoming/outgoing surface 22C with a wide pitch (arrangement pitch (d1)) into optical fluxes with a narrow pitch (arrangement pitch (d2)) by the incoming/outgoing surface 22C. Accordingly, it is possible to perform the pitch conversion with the simple configuration in the optical transmission system 5.

Further, the incoming/outgoing surface 22C is disposed such that the angle formed by the line segment parallel to the optical axis of the insertion port 21A and the incoming/outgoing surface 22C is smaller than 45 degrees. This makes it possible to further reduce the thickness of the optical path conversion device 22. Further, it is possible to lower the position of the plug lens 33 to reduce the height of the optical transmission system 5.

Further, in the optical transmission system 5, since the incoming/outgoing surface 22C is in contact with the air, it is possible to increase the refractive index difference (n1−n2) on the incoming/outgoing surface 22C. As a result, it is possible to make a conversion range of the pitch conversion larger, which makes it possible to handle the arrangement pitch (d1) with various sizes.

Moreover, in the optical transmission system 5, the reflective surface 22B is provided in the optical path between the incoming/outgoing surface 22A and the plurality of optical devices 12a. This makes it possible to further reduce the thickness of the optical path conversion device 22 as compared with a case where the reflective surface 22B is not provided. Further, it is possible to lower the position of the plug lens 33 to reduce the height of the optical transmission system 5.

Further, in the optical transmission system 5, the reflective surface 22B is disposed such that the angle formed by the line segment parallel to the optical axis of the insertion port 21A and the reflective surface 22B is smaller than 45 degrees. Therefore, when the light entering from the incoming/outgoing surface 22A is reflected by the reflective surface 22B, it is easy to cause the reflected light to enter the optical devices 12a in parallel to or substantially in parallel to the optical axes of the respective optical devices 12a. As a result, it is possible to cause the reflected light to enter the optical devices 12a as is or to enter the optical devices 12a at an angle considering returned light described later.

2. Modification Examples

Next, modification examples of the above-described embodiment are described. Note that, in the following, components common to those in the above-described embodiment are denoted by the same reference numerals. Further, description of the components common to those in the above-descried embodiment is appropriately omitted.

[Modification Example A]

The reflective surface 22B is a flat surface in the above-described embodiment; however, the reflective surface 22B may have a curved surface. For example, as illustrated in FIG. 6, the reflective surface 22B may include convex lens parts 22B-2 (convex shapes) at positions where light from the optical devices 12a respectively enters or at positions where light from the optical fibers 31A respectively enters on a one by one basis, and include a flat part 22B-1 at a position other than these positions. Each of the convex lens parts 22B-2 acts on the light from a corresponding one of the optical devices 12a so as to convert diffusion light into collimated light. Each of the convex lens parts 22B-2 acts on light from a corresponding one of the optical fibers 31A so as to convert collimated light into convergent light. Providing the convex lens parts 22B-2 acting in such a manner on the reflective surface 22B makes it possible to omit the above-described receptor lens 12b. As a result, it is possible to reduce the manufacturing cost through reduction of the number of components, and to reduce the height of the optical transmission system 5 by the above-described omission of the receptor lens 12b.

Note that, in the present modification example, in a case where the above-described receptor lens 12b is omitted, for example, a photoelectric converter 13 in which the optical devices 12a are mounted on an intermediate substrate may be used in place of the photoelectric converter 12, as illustrated in FIG. 6.

[Modification Example B]

In the embodiment and the modification example A described above, each of the reflective surface 22B and the incoming/outgoing surface 22C includes only one flat surface. Each of the reflective surface 22B and the incoming/outgoing surface 22C, however, may include a plurality of flat surfaces. For example, as illustrated in FIG. 7, the reflective surface 22B may include two flat surfaces 22B-3 and 22B-4, and the incoming/outgoing surface 22C may include two flat surfaces 22C-1 and 22C-2. The two flat surfaces 22B-3 and 22B-4 correspond to a specific example of "plurality of second flat surfaces" in the present technology. The two flat surfaces 22C-1 and 22C-2 correspond to a specific example of "plurality of first flat surfaces" in the present technology.

In this example, the two flat surfaces 22C-1 and 22C-2 are disposed so as to form the reflective surface 22B in a recessed shape. As a result, in a case where the plurality of optical fibers 31A includes a portion where the arrangement pitch (d2) is relatively large, for example, as illustrated in FIG. 7, the light from the optical fibers 31A are refracted by the flat surfaces 22C-1 and 22C-2 as if the arrangement pitch (d2) is an equal interval.

Further, the two flat surfaces 22C-1 and 22C-2 are disposed to form the incoming/outgoing surface 22C in a recessed shape. This makes it possible to parallelize the optical fluxes refracted by the flat surfaces 22C-1 and 22C-2 while reflecting the optical fluxes with equal intervals, for example, as illustrated in FIG. 7.

[Modification Example C]

In the embodiment and the modification example B described above, the incoming/outgoing surface 22A is a flat surface; however, the incoming/outgoing surface 22A may include a curved surface. For example, as illustrated in FIG. 8, the incoming/outgoing surface 22A may include convex lens parts 22A-1 (convex shape) at positions where light from the optical devices 12a respectively enters or positions where light from the optical fibers 31A respectively enters on a one by one basis, and may include a flat part 22A-2 at a position other than these positions. Each of the convex lens parts 22A-1 acts on the light from a corresponding one of the optical devices 12a so as to convert diffusion light into collimated light. Each of the convex lens parts 22A-1 acts on light from a corresponding one of the optical fibers 31A so as to convert collimated light into convergent light. Providing the convex lens parts 22A-1 acting in such a manner on the incoming/outgoing surface 22A makes it possible to omit the above-described receptor lens 12b. As a result, it is possible to reduce the manufacturing cost through reduction of the number of components, and to reduce the height of the optical transmission system 5 by the above-described omission of the receptor lens 12b.

Note that, in the present modification example, in a case where the above-described receptor lens 12b is omitted, the photoelectric converter 13 in which the optical devices 12a are mounted on the intermediate substrate may be used in place of the photoelectric converter 12, for example, as illustrated in FIG. 6.

[Modification Example D]

In the embodiment and the modification examples A to C described above, the optical path conversion device 22 and the optical devices 12a are disposed such that the incoming/outgoing surface 22A is orthogonal to or substantially orthogonal to the optical axes of the respective optical devices 12a. In the embodiment and the modification examples A to C described above, however, the optical path conversion device 22 and the optical devices 12a may be disposed such that the incoming/outgoing surface 22A obliquely intersects with the optical axes of the respective optical devices 12a. This makes it possible to reduce entry, into each of the optical devices 12a, of light that has been reflected by and returned from the incoming/outgoing surface 22A (returned light) out of light outputted from each of the optical devices 12a. As a result, it is possible to reduce "returned light noise" contained in the light from each of the optical devices 12a.

For example, as illustrated in FIG. 9, the incoming/outgoing surface 22A may include an inclined surface. The incoming/outgoing surface 22A preferably has an inclination angle that sufficiently reduces intensity of the returned light. FIG. 10 illustrates an example of relationship between the inclination angle of the incoming/outgoing surface 22A and the intensity of the retuned light, in the optical path conversion device 22 of FIG. 9. As illustrated in FIG. 10, the optical path conversion device 22 and the optical devices 12a are preferably disposed such that the surface, facing the respective optical devices 12a, of the optical path conversion device 22 of FIG. 9 obliquely intersects with the optical axes of the respective optical devices 12a at an angle equal to or larger than 2 degrees.

FIG. 11 illustrates a design example of the optical path conversion device 22 of FIG. 9. The arrangement pitch (d1) of the plurality of optical devices 12a is set to 0.5 mm, and the arrangement pitch (d2) of the plurality of optical fibers 31A is set to 0.24 mm. Further, the refractive index n1 of the optical path conversion device 22 is set to 1.5, and the refractive index n2 of the environmental medium (air) is set to 1.0. At this time, the angle θ1 is set to 38 degrees, the angle θ2 is set to 68 degrees, and the inclination angle (angle θ3) of the incoming/outgoing surface 22C is set to 23 degrees. At this time, in a case where the angle θ4 is set to 28 degrees and the inclination angle (angle θ6) of the incoming/outgoing surface 22A is set to 20 degrees, the inclination angle (angle θ5) of the reflective surface 22B becomes 27 degrees.

In addition, for example, as illustrated in FIG. 12, the incoming/outgoing surface 22A may obliquely intersect with the optical axes of the respective optical devices 12a by inclining the circuit substrate 11. Further, for example, as illustrated in FIG. 13, the incoming/outgoing surface 22A may obliquely intersect with the optical axes of the respective optical devices 12a by mounting the optical path conversion device 22 obliquely to the circuit substrate 11. For example, an electroconductive base 14 is provided on the electrode pad of the circuit substrate 11, and one solder bump 12c of the optical path conversion device 22 is coupled to the base 14, which makes it possible to mount the optical path conversion device 22 obliquely to the circuit substrate 11.

[Modification Example E]

In the embodiment and the modification examples A to D described above, the photoelectric converter 12 may include a plurality of eccentric lenses 12b-2 in place of the plurality of convex lens parts 12b-1, for example, as illustrated in FIG. 14. Each of the eccentric lenses 12b-2 is configured by decentering each of the convex lens parts 12b-1. Each of the eccentric lenses 12b-2 acts so as to convert light (diffusion light) from a corresponding one of the optical devices 12a into collimated light that travels in a direction oblique to the optical axis of the eccentric lens 12b-2. This makes it possible to reduce entry, into each of the optical devices 12a, of light that has been reflected by and returned from the incoming/outgoing surface 22A (returned light), out of light emitted from each of the optical devices 12a. As a result, it is possible to reduce "returned light noise" contained in the light from each of the optical devices 12a.

[Modification Example F]

In the embodiment and the modification examples A to D described above, the photoelectric converter 12 may include an inclined portion 12d between the respective convex lens parts 12b-1 and the surface (incoming/outgoing surface 22A) facing the optical devices 12a of the optical path conversion device 22, for example, as illustrated in FIG. 15. The inclined portion 12d includes an inclined surface 12d-1 that obliquely intersects with the optical axes of the respective optical devices 12a. The inclined surface 12d-1 corresponds to a specific example of "second light refractive surface" in the present technology. This makes it possible to reduce entry, into each of the optical devices 12a, of light that has been reflected by and returned from the incoming/outgoing surface 22A (returned light), out of light emitted from the optical devices 12a. As a result, it is possible to reduce "returned light noise" contained in the light from each of the optical devices 12a.

[Modification Example G]

In the embodiment and the modification examples A to D described above, for example, as illustrated in FIG. 16, the photoelectric converter 12 may include a plurality of convex lens parts 12e-1 between the respective convex lens parts 12b-1 and the surface (incoming/outgoing surface 22A) facing the optical devices 12a of the optical path conversion device 22, in place of the plurality of convex lens parts 12b-1. Each of the plurality of convex lens parts 12e-1 has an optical axis obliquely intersecting the optical axis of a corresponding one of the optical devices 12a. The plurality of convex lens parts 12e-1 are provided on, for example, the top surface of the receptor lens 12b. At this time, the top surface of the receptor lens 12b is an inclined surface 12e. This makes it possible to reduce entry, into each of the optical devices 12a, of light that has been reflected by and returned from the incoming/outgoing surface 22A (returned light), out of light emitted from the optical devices 12a. As a result, it is possible to reduce "returned light noise" contained in the light from each of the optical devices 12a.

[Modification Example H]

In the embodiment and the modification examples A to G described above, the optical path conversion device 22 may further include, at a position facing the insertion port 21A, a positioning part 22E that defines a position of the front end of the optical fiber array 31, for example, as illustrated in FIG. 17. The positioning part 22E is, for example, an abutting structure that suppresses displacement (two-dimensional displacement) of the optical fiber module 3 in a direction orthogonal to the optical axis direction of the optical fiber module 3. Note that the positioning part 22E may be an abutting structure that suppresses, for example, only displacement of the optical fiber module 3 in the optical axis direction of the optical fiber module 3. The abutting structure may be a structure that causes the flat surfaces to abut on each other, or a structure that causes abutting in a V-shape. As described above, providing the positioning part 22E on the optical path conversion device 22 makes it possible to variation of optical coupling efficiency caused by positional displacement of the optical fiber module 3.

[Modification Example I]

In the embodiment and the modification examples C to H described above, the incoming/outgoing surface 22C of the optical path conversion device 22 may be disposed directly above the respective optical devices 12a, for example, as illustrated in FIG. 18. In this case, the reflective surface 22B is omitted in the optical path conversion device 22. Even in such a case, it is possible to perform the pitch conversion with a simple configuration as with the above-described embodiment.

[Modification Example J]

In the embodiment and the modification examples A to I described above, the optical receptacle 20 may include the optical path conversion device 22 that includes the incoming/outgoing surface 22C on the surface, and an optical path conversion device 23 that is fixed in contact with the incoming/outgoing surface 22C, for example, as illustrated in FIG. 19. The incoming/outgoing surface 22C corresponds to a specific example of "first light refractive surface" in the present technology. The optical path conversion device 22 corresponds to a specific example of "first optical block" in the present technology. The optical path conversion device 23 corresponds to a specific example of "second optical block" in the present technology. The optical path conversion device 23 includes, for example, a light transmissive polyhedron that has a refractive index higher than a refractive index of the surrounding space of the optical path conversion devices 22 and 23. The optical path conversion device 23 includes a polyhedron containing, for example, glass, crystal, or the like. In the optical path conversion device 23, a surface where the light from the optical fiber array 31 enters is preferably a flat surface and is preferably orthogonal to or substantially orthogonal to the optical axis of the optical fiber array 31. Other parts of the optical path conversion device 23 are not particularly restricted. Accordingly, for example, the optical path conversion device 23 may be mounted on the circuit substrate 11 to eliminate contact of the optical path conversion device 22 with the housing 21. As described above, providing the optical path conversion device 23 increases installation flexibility of the optical path conversion device 23.

[Modification Example K]

In the embodiment and the modification examples A to J described above, a front end part of the plug lens 33 may have a step structure. At this time, one of the plurality of convex lens parts 33A may be provided for each of steps at the front end part of the plug lens 33, for example, as illustrated in FIG. 20. In such a case, it is possible to reduce difference of the optical path length to the incoming/outgoing surface 22C among the convex lens parts 33A, and to reduce difference in optical coupling efficiency. However, in a case where the thickness of the plug lens 33 (length of a portion covered with plug lens 33 of each of optical fibers 31A) is different among the optical fibers 31A, for example, it is necessary to adjust a focal length of each of the convex lens parts 33A depending on the thickness of the plug lens 33, as illustrated in FIG. 20.

Note that, as illustrated in FIG. 21, the thickness of the plug lens 33 (length of the portion covered with plug lens 33 of each of optical fibers 31A) may be equal or substantially equal among the optical fibers 31A. In such a case, it is possible to form the convex lens parts 33A with the same shape as one another, which makes it easy to manufacture the plug lens 33 as compared with the case of FIG. 20.

[Modification Example L]

In the embodiment and the modification examples A to J described above, the plurality of optical devices 12a may be arranged in a zigzag manner, for example, as illustrated in FIG. 22A. In this case, however, the plurality of optical fibers 31A are preferably arranged in a zigzag manner in a direction corresponding to the arrangement direction of the plurality of optical devices 12a, for example, as illustrated in FIG. 22B. This improves optical coupling efficiency of the plurality of optical devices and the plurality of optical fibers.

Hereinbefore, the present technology is described with reference to the embodiment and the modification examples thereof; however, the present technology is not limited to the above-described embodiment and the like, and various modifications may be made. Note that the effects described in the present specification are illustrative. The effects achieved by the present technology are not limited to the effects described in the present specification. The present technology may achieve effects other than the effects described in the present specification.

Moreover, the present technology may have the following configurations.

(1)

An optical interface apparatus, including:

a plurality of optical devices that are arranged in one line or in a zigzag manner; and an optical path conversion device that includes a first light refractive surface inclined to an arrangement direction of the plurality of optical devices.

(2)

The optical interface apparatus according to (1), further including a housing that includes an insertion port into which a front end of an optical fiber array is inserted, and houses the plurality of optical devices and the optical path conversion device, in which the first light refractive surface obliquely faces the insertion port.

(3)

The optical interface apparatus according to (2), in which the first light refractive surface is disposed to cause an angle that is formed by a line segment parallel to an optical axis of the insertion port and the first light refractive surface, to be smaller than 45 degrees.

(4)

The optical interface apparatus according to any one of (1) to (3), in which the first light refractive surface is in contact with air.

(5)

The optical interface apparatus according to any one of (1) to (3), in which the optical path conversion device includes:

a first optical block that includes the first light refractive surface on a surface, and a second optical block that is fixed in contact with the first light refractive surface.

(6)

The optical interface apparatus according to any one of (1) to (5), in which the optical path conversion device includes a light reflective surface in an optical path between the first light refractive surface and the plurality of optical devices.

(7)

The optical interface apparatus according to (6), in which the light reflective surface is disposed to cause an angle that is formed by the line segment parallel to the optical axis of the insertion port and the light reflective surface, to be smaller than 45 degrees.

(8)

The optical interface apparatus according to (6) or (7), in which the optical path conversion device includes a plurality of convex shapes on the light reflective surface or on a surface facing the respective optical devices of the optical path conversion device.

(9)

The optical interface apparatus according to (6) or (7), in which the optical path conversion device includes a flat surface on the light reflective surface and on a surface facing the plurality of optical devices of the optical path conversion device, and the optical interface apparatus further includes a plurality of convex lenses between the respective optical devices and the surface facing the respective optical devices of the optical path conversion device.

(10)

The optical interface apparatus according to (6) or (7), in which the first light refractive surface includes a plurality of first flat surfaces, the light reflective surface includes a plurality of second flat surfaces, the plurality of first flat surfaces are disposed to form the first light refractive surface in a recessed shape, and the plurality of second flat surfaces are disposed to form the light reflective surface in a recessed shape.

(11)

The optical interface apparatus according to (1) to (5), in which the first light refractive surface is disposed directly above the respective optical devices.

(12)

The optical interface apparatus according to any one of (1) to (5), in which the optical path conversion device and the respective optical devices are disposed to cause a surface facing the respective optical devices of the optical path conversion device to obliquely intersect with optical axes of the respective optical devices.

(13)

The optical interface apparatus according to (12), in which the optical path conversion device and the respective optical devices are disposed to cause the surface facing the respective optical devices of the optical path conversion device to obliquely intersect with the optical axes of the respective optical devices at an angle equal to or larger than 2 degrees.

(14)

The optical interface apparatus according to (6) or (7), in which the optical path conversion device includes a flat surface on the light reflective surface and on a surface facing the plurality of optical devices of the optical path conversion device, and the optical interface apparatus further includes a plurality of eccentric lenses between the respective optical devices and the surface facing the respective optical device of the optical path conversion device.

(15)

The optical interface apparatus according to (6) or (7), in which the optical path conversion device includes a flat surface on the light reflective surface and on a surface facing the plurality of optical devices of the optical path conversion device, and the optical interface apparatus further includes a plurality of convex lenses between the respective optical devices and the surface facing the respective optical devices of the optical path conversion device, and includes a second light refractive surface that obliquely intersects with optical axes of the respective optical devices, between the respective convex lenses and the surface facing the respective optical devices of the optical path conversion device.

(16)

The optical interface apparatus according to (6) or (7), in which the optical path conversion device includes a flat surface on the light reflective surface and on a surface facing the plurality of optical devices of the optical path conversion device, and the optical interface apparatus further includes a plurality of convex lenses that each include an optical axis obliquely intersecting with the optical axis of a corresponding one of the optical devices, between the respective optical devices and the surface facing the respective optical devices of the optical path conversion device.

(17)

The optical interface apparatus according to any one of (1) to (5), in which the optical path conversion device further includes, at a position facing the insertion port, a positioning part that defines a position of the front end of the optical fiber array.

(18)

An optical transmission system, including:

a plurality of optical devices that are arranged in one line or in a zigzag manner;

an optical path conversion device that includes a first light refractive surface inclined to an arrangement direction of the plurality of optical devices;

an optical fiber array that includes a plurality of optical fibers arranged in one line or in a zigzag manner in a direction corresponding to the arrangement direction of the plurality of optical devices; and a housing that includes an insertion port into which a front end of the optical fiber array is inserted, and houses the plurality of optical devices and the optical path conversion device.

(19)

The optical transmission system according to (18), in which the plurality of optical fibers are arranged in one line or in a zigzag manner with an arrangement pitch smaller than an arrangement pitch of the plurality of optical devices, and the first light refractive surface obliquely faces the insertion port and is disposed to cause an angle that is formed by a line segment parallel to an optical axis of the insertion port and the first light refractive surface, to be smaller than 45 degrees.

(20)

An optical path conversion device disposed between a plurality of optical devices that are arranged in one line or in a zigzag manner and a plurality of optical fibers that are arranged in one line or in a zigzag manner with an arrangement pitch different from an arrangement pitch of the plurality of optical devices, the optical path conversion device including a light refractive surface for pitch conversion.

(21) The optical path conversion device according to (20), in which
the optical path conversion device is a block-shaped optical device,
the light refractive surface is provided on a surface of the block-shaped optical device, and
the block-shaped optical device includes a light reflective surface at a position of the block-shaped optical device on a side opposite to the light refractive surface.

This application is based upon and claims the benefit of priority of the Japanese Patent Application No. 2015-206070 filed with the Japan Patent Office on Oct. 20, 2015, the entire contents of which are incorporated herein by reference.

It should be understood by those skilled in the art that various modifications, combinations, sub-combinations, and alterations may occur depending on design requirements and other factors insofar as they are within the scope of the appended claims or the equivalents thereof.

The invention claimed is:

1. An optical interface apparatus, comprising:
a plurality of optical devices in one of a line pattern or a zigzag pattern;
an optical path conversion device that includes a first light refractive surface inclined to an arrangement direction of the plurality of optical devices; and
a housing that includes an insertion port into which a front end of an optical fiber array is inserted, wherein
the plurality of optical devices and the optical path conversion device are included in the housing, and
the first light refractive surface obliquely faces the insertion port.

2. The optical interface apparatus according to claim 1, wherein a first angle between a line segment parallel to an optical axis of the insertion port and the first light refractive surface is smaller than 45 degrees.

3. The optical interface apparatus according to claim 2, wherein the first light refractive surface is in contact with air.

4. The optical interface apparatus according to claim 2, wherein the optical path conversion device further includes:
a first optical block that includes the first light refractive surface on a surface, and
a second optical block that is fixed in contact with the first light refractive surface.

5. The optical interface apparatus according to claim 2, wherein the optical path conversion device further includes a light reflective surface in an optical path between the first light refractive surface and the plurality of optical devices.

6. The optical interface apparatus according to claim 5, wherein a second angle between the line segment parallel to the optical axis of the insertion port and the light reflective surface is smaller than 45 degrees.

7. The optical interface apparatus according to claim 5, wherein the optical path conversion device further includes a plurality of convex shapes, and
wherein each of the plurality of convex shapes is on one of the light reflective surface or a surface that faces a respective optical device of the plurality of optical devices of the optical path conversion device.

8. The optical interface apparatus according to claim 5, wherein
the optical path conversion device further includes a flat surface on the light reflective surface and on a surface that faces the plurality of optical devices of the optical path conversion device,
the optical interface apparatus further includes a plurality of convex lenses, and
each of the plurality of convex lenses is between a respective optical device of the plurality of optical devices and the surface that faces the respective optical device of the optical path conversion device.

9. The optical interface apparatus according to claim 5, wherein
the first light refractive surface includes a plurality of first flat surfaces,
the light reflective surface includes a plurality of second flat surfaces,
the plurality of first flat surfaces are arranged such that the first light refractive surface is in a recessed shape, and
the plurality of second flat surfaces are arranged such that the light reflective surface is in the recessed shape.

10. The optical interface apparatus according to claim 5, wherein
the optical path conversion device further includes a flat surface on the light reflective surface and on a surface that faces the plurality of optical devices of the optical path conversion device,
the optical interface apparatus further includes a plurality of eccentric lenses, and
each of the plurality of eccentric lenses is between a respective optical device of the plurality of optical devices and the surface that faces the respective optical device of the optical path conversion device.

11. The optical interface apparatus according to claim 5, wherein
the optical path conversion device further includes a flat surface on the light reflective surface and on a surface that faces the plurality of optical devices of the optical path conversion device, and
the optical interface apparatus further includes:
a plurality of convex lenses, each of the plurality of convex lenses is between a respective optical device of the plurality of optical devices and the surface that faces the respective optical device of the optical path conversion device, and
a second light refractive surface that obliquely intersects with optical axes of the respective optical device, between a respective convex lens of the plurality of convex lenses and the surface that faces the respective optical device of the optical path conversion device.

12. The optical interface apparatus according to claim 5, wherein
the optical path conversion device further includes a flat surface on the light reflective surface and on a surface that faces the plurality of optical devices of the optical path conversion device,
the optical interface apparatus further includes a plurality of convex lenses, and
each of the plurality of convex lenses includes an optical axis that obliquely intersects with an optical axis of a corresponding one of the plurality of optical devices, between a respective optical device of the plurality of optical devices and the surface that faces the respective optical device of the optical path conversion device.

13. The optical interface apparatus according to claim 2, wherein the first light refractive surface is directly above a respective optical device of the plurality of optical devices.

14. The optical interface apparatus according to claim 2, wherein a surface, that faces a respective optical device of the plurality of optical devices of the optical path conversion device, obliquely intersects with optical axes of the respective optical device.

15. The optical interface apparatus according to claim 14, wherein the surface, that faces the respective optical device of the optical path conversion device, obliquely intersects with the optical axes of the respective optical device at a second angle that is one of equal to or larger than 2 degrees.

16. The optical interface apparatus according to claim 2, wherein the optical path conversion device further includes, at a first position that faces the insertion port, a positioning part that defines a second position of the front end of the optical fiber array.

17. An optical transmission system, comprising:
   a plurality of optical devices in one of a line pattern or a zigzag pattern;
   an optical path conversion device that includes a first light refractive surface inclined to an arrangement direction of the plurality of optical devices;
   an optical fiber array that includes a plurality of optical fibers in one of the line pattern or the zigzag pattern in a direction corresponding to the arrangement direction of the plurality of optical devices; and
   a housing that includes an insertion port into which a front end of the optical fiber array is inserted, wherein
      the plurality of optical devices and the optical path conversion device are included in the housing, and
      the first light refractive surface obliquely faces the insertion port.

18. The optical transmission system according to claim 17, wherein
   an arrangement pitch of the plurality of optical fibers in one of the line pattern or the zigzag pattern is smaller than an arrangement pitch of the plurality of optical devices, and
   an angle between a line segment parallel to an optical axis of the insertion port and the first light refractive surface is smaller than 45 degrees.

19. An optical path conversion device, comprising:
   a light refractive surface for pitch conversion,
   wherein
      the optical path conversion device is between a plurality of optical devices in one of a line pattern or a zigzag pattern, and a plurality of optical fibers in one of the line pattern or the zigzag pattern,
      an arrangement pitch of the plurality of optical fibers is different from an arrangement pitch of the plurality of optical devices,
      the light refractive surface obliquely faces an insertion port, and
      a front end of each of the plurality of optical fibers is inserted into the insertion port.

20. The optical path conversion device according to claim 19, wherein
   the optical path conversion device is a block-shaped optical device,
   the light refractive surface is on a surface of the block-shaped optical device, and
   the block-shaped optical device includes a light reflective surface at a position, of the block-shaped optical device, that is opposite to a position of the light refractive surface.

* * * * *